(12) United States Patent
Shields et al.

(10) Patent No.: US 11,360,154 B1
(45) Date of Patent: Jun. 14, 2022

(54) METHOD FOR THERMAL ABUSE TESTING OF A LITHIUM-ION BATTERY

(71) Applicant: The United States of America, as represented by the Secretary of the Navy, Arlington, VA (US)

(72) Inventors: Eric Bennet Shields, Reston, VA (US); Gordon H. Waller, Vienna, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 200 days.

(21) Appl. No.: 16/584,662

(22) Filed: Sep. 26, 2019

(51) Int. Cl.
*G01R 31/392* (2019.01)
*H01M 10/42* (2006.01)
*G01R 31/374* (2019.01)

(52) U.S. Cl.
CPC ......... *G01R 31/392* (2019.01); *G01R 31/374* (2019.01); *H01M 10/4285* (2013.01)

(58) Field of Classification Search
CPC ............... G01R 31/392; G01R 31/374; G01R 31/2849; G01R 31/385; H01M 10/428; H01M 10/4285; H01M 10/486; H01M 10/6571; Y02E 60/10
USPC .......... 324/400, 430, 433, 500, 600, 764.01, 324/103 R, 771, 761.01, 501, 639, 642, 324/702, 76.11, 76.66, 96
See application file for complete search history.

(56) References Cited

U.S. PATENT DOCUMENTS

| 8,104,953 | B2 | 1/2012 | Van Suetendael et al. |
|---|---|---|---|
| 9,465,077 | B2 | 10/2016 | Love et al. |
| 9,622,294 | B1 | 4/2017 | Ostanek |
| 9,755,456 | B1 | 9/2017 | Peterson et al. |
| 9,866,051 | B2 | 1/2018 | Peterson et al. |
| 10,164,304 | B1 | 12/2018 | Ostanek |
| 2016/0006081 | A1* | 1/2016 | Eaglesham ............ G01R 31/36 429/50 |

(Continued)

OTHER PUBLICATIONS

Performance Specification, Battery, Rechargeable, Sealed, 6T Lithium-Ion, MIL-PRF-32565, Nov. 17, 2016.

(Continued)

*Primary Examiner* — Douglas X Rodriguez
*Assistant Examiner* — Trung Q Nguyen
(74) *Attorney, Agent, or Firm* — Howard Kaiser (57) ABSTRACT

According to an exemplary embodiment of the inventive test method, heat is externally applied to an electrochemical "trigger" test cell via a heating element that receives electrical current from a power supply that is characterized by approximately the same impedance as the trigger test cell. For instance, the power supply and the trigger cell can be same or similar cells. The trigger test cell is proximate "propagation-vulnerable" test cells in a cell pack. Because of the impedance-matching between the power supply and the trigger test cell, the ensuing propagative behavior is at least substantially attributable to the short-circuit current failure of the trigger cell as brought about by the externally applied heat. The energy and/or power characterizing the power supply's current at least approximately equates to the energy and/or power characterizing the trigger test cell's short circuit current. Exemplary inventive testing is propitiously representative of real-world propagative failure events.

20 Claims, 5 Drawing Sheets

(56) References Cited

U.S. PATENT DOCUMENTS

2020/0036068 A1\* 1/2020 Recoskie ........... G01R 31/2849

OTHER PUBLICATIONS

David Rosewater, "Energy Storage System Safety—Codes & Standards," Presentation for EMA Energy Storage Workshop, Singapore, Aug. 2015.

Qibo Li et al., "Thermal Runaway Propagation Modeling in Lithium Ion Modules with and without PCM," National Renewable Energy Laboratory (NREL), International Battery Seminar and Exhibit, Mar. 20-23, 2017, Fort Lauderdale, Florida.

Laurie Florence, How Safety Standards Address the Hazard of Fire Propagation in Battery Systems, ESS Safety Forum 2017, Feb. 22, 2017.

Christopher J. Orendorff et al., "Propagation Testing Multi-Cell Batteries," Sandia Report, SAND2014-17053, Unlimited Release, Printed Oct. 2014.

"Fire Hazard Analysis for Various Lithium Batteries," DOT/FAA/TC-16/17, U.S. Department of Transportation, Federal Aviation Administration, Mar. 2017, Final Report.

Said Al-Hallaj, "Preventing Thermal Runaway Propagation in Li-ion Batteries," Chemical Engineering 2017 3rd International Conference onChemical Engineering, Oct. 2-4, 2017, Chicago, J Chem Eng Process Technol, vol. 8, Issue 5 (Suppl).

Hans-Georg Schweiger et al., "Comparison of Several Methods for Determining the Internal Resistance of Lithium Ion Cells," Sensors 2010, 10, 5604-5625, published Jun. 3, 2010.

Eric Shields and Jason Leonard, Department of Navy Battery Development and Safety Program, Feb. 13, 2019.

Joshua Lamb et al., "Failure Propagation in Multi-Cell Lithium Ion Batteries," Journal of Power Sources 283 (2015) 517e523, Elsevier, available online Oct. 22, 2014.

Nicholas E. M. Pasquini, "There's a Better Way to Get Batteries for the Navy," Naval Science and Technology Future Force Magazine, Oct. 21, 2019.

2017 ESS Safety Forum: Schedule, Feb. 22-24, 2017, U.S. Department of Energy, Energy Storage Systems Program, available online https://share-ng.sandia.gov/ess/ess-safety-forum-2017/schedule/, printed out Jun. 1, 2021.

\* cited by examiner

METHOD FOR THERMAL ABUSE TESTING OF A LITHIUM-ION BATTERY

STATEMENT OF GOVERNMENT INTEREST

The invention described herein may be manufactured and used by or for the Government of the United States of America for governmental purposes without payment of any royalties thereon or therefor.

BACKGROUND OF THE INVENTION

The present invention relates to batteries, more particularly to methods and apparatuses for testing thermal characteristics of batteries such as lithium-ion batteries.

Lithium-ion (Li-ion) batteries have become commonplace in many everyday items (e.g., in laptops, cell phones, and other personal or portable electronic devices), and are increasingly being used as larger batteries in more demanding applications (e.g., in homes, electric vehicles, and power-grid systems). Cost and safety have historically been barriers to wider deployment of lithium-ion batteries. However, with prices of lithium-ion batteries falling, safety remains the largest and most important challenge. It is known that the performance of lithium-ion batteries is sensitive to ambient temperature. In particular, there is a risk of battery failure from overheating. It is desirable, for instance, for a battery system to maintain uniformity in temperature across the individual cells within the battery system.

Lithium-ion batteries are known to pose a risk of fire when operated at higher temperatures, e.g., temperatures above approximately 60° C. Catastrophic failure of lithium-ion batteries has been known to occur due to "thermal runaway." If the internal temperature of a lithium-ion battery exceeds an onset temperature, this may result in thermal runaway whereby chemical reaction rates increase uncontrollably, possibly leading to fire and/or explosion. Catastrophic failures of lithium-ion batteries have occurred in many documented cases, and many product recalls have involved lithium-ion batteries. Suffice it to say that there is great interest in alleviating safety concerns associated with high temperatures of operation of lithium-ion batteries.

To characterize the safety of lithium batteries, various test methods have been practiced by private industry and by Government agencies such as NASA, DOE, and DoD. These conventional test methods to confirm safe design include overcharge, over-discharge, short circuit, electrical safety device evaluations, and thermal abuse. However, the largest threat that remains in any lithium battery pack is either that of a latent cell defect (e.g., a piece of foreign material that found its way into the cell during manufacture), or that of an internal short circuit created over time through dendrite growth (e.g., a battery is charged too fast, too cold, too many times, building up a small lithium spike that eventually short circuits the cell). While careful evaluation of cells after manufacture can reduce the likelihood that a defective cell gets put in a battery, the risk cannot be eliminated.

Generally speaking, the risk of a battery fire transcends single-cell failure involving production of flame and gas. The greater risk resides in the likelihood that one "trigger" (heated) cell failure will cascade to numerous cells (perhaps even hundreds or thousands of cells) around it. This phenomenon is commonly referred to as "propagation," and much effort is invested to prevent this from occurring. Propagation, more than any other circumstance of battery failure, is impeding the implementation of advanced lithium batteries in many challenging applications. As elaborated upon hereinbelow, each of the safety tests currently used to characterize propagation suffers from major limitations.

The overcharge approach to testing propagative battery failure, as currently practiced, involves overcharging a cell to thermal runaway. This approach is widely considered by experts in the field as poorly representative of internal cell failure for three reasons. First, overcharge-type testing simulates a rather unrealistic condition for a cell, as batteries commonly have a Battery Management System (BMS) in place to prevent such events from occurring. Second, this testing approach injects much more energy into a cell than the cell would have under a more realistic failure condition. Third, such testing, depending on the cell design, may at times represent an "under test," as the cell failure reaction can be so violent that it rapidly distributes hot cell contents across a large volume, preventing more localized intense peer-to-peer conduction pathways that might otherwise create a secondary adjacent cell failure.

Another approach to testing propagative battery failure is to purposefully embed a short-circuit device in a cell that can be triggered to react on demand and directly simulate a cell failure. This approach has largely been pioneered by NASA using a wax covered conductive patch. However, this approach also has some drawbacks, viz., costliness to embed a device in a cell; required access to cells during manufacture, which is often not possible; creating certain assumptions about cell failure conditions that cannot be truly known of the embedded device (e.g., size, shape, conductivity, orientation).

Less common is an approach of using a nail of a specific size to penetrate a cell, thereby creating a hard short circuit. This is typically done with different nail sizes at different speeds, depending on the standard being applied. While this approach has been often used for single cell tests as a cost-effective way to characterize failure, it is not often used in propagation tests for various reasons. Nail penetration apparatus are often large and impractical to apply to many pack designs. Physical damage to cells (e.g., wall penetration) leads to inaccurate gas buildup and venting behaviors. The current-carrying pathway of the nail may overestimate or underestimate the true thermal response of an internal failure. Actually, such overestimation or underestimation of true thermal response represents a notable challenge with all current methods.

The most common testing approach is to "thermally abuse" an individual cell, doing so from a location external to the cell. The "thermal abuse" approach has historically been done by using heater rods, heater wraps, and (less commonly) lasers. There are several drawbacks to the thermal abuse approach. First, the heating rate can be a source of difficulty, as it should be neither too fast nor too slow. If the heating rate is too fast, then the cell can wall will weaken, leading to increased likelihood of sidewall rupture, which in turn increases likelihood of propagation. On the other hand, if the heating rate is too slow, adjacent cells begin to heat up, thereby increasing their likelihood of propagation. Second, a true behavior of an internal failure is focused and localized around the failure point. In the thermal abuse approach, if the orientation of heating is not focused and localized, the heating does not represent a true behavior of an internal failure. Third, the heating rate according to conventional thermal abuse practice is often specified and static, and is not cell dependent (e.g., 5 degrees Celsius per minute for all cells).

SUMMARY OF THE INVENTION

In view of the foregoing, an object of the present invention is to provide an improved methodology for conducting thermal testing of lithium-ion batteries.

In accordance with exemplary practice of the present invention, a test method for an electrochemical cell includes associating a heating element with an electrochemical test cell, and delivering current to the heating element. The delivery of the current includes using a power supply. The heating of the heating element, which results from the delivery of the current, causes a failure of the test cell due to a short-circuit current in the test cell. The power and energy characterizing the power supply in supplying the current is at least approximately equal to the power and energy characterizing the test cell in experiencing the failure. According to frequent inventive practice, the test cell is a propagation-trigger test cell and is closely configured with a plurality of adjacent test cells in a pack of test cells. The short-circuit current failure of the propagation-trigger test cell results in propagative failure of at least one adjacent test cell.

The present invention, as exemplarily practiced, provides a unique methodology for conducting battery safety testing involving thermal abuse of an electrochemical cell (e.g., a lithium-ion battery). In general principle, exemplary embodiments of the inventive method involve an external thermal abuse approach to conducting safety testing of an electrochemical cell. In a manner analogous to a common practice of external thermal abuse testing, exemplary inventive practice provides for application of a resistive patch heater to precipitate and analyze simulation of internal short circuiting and ensuing propagation.

However, in significant contradistinction to a conventional practice of thermal abuse testing, the present invention effects thermal abuse testing in a manner that couples inherent physical characteristics of a lithium-ion cell with physical behaviors of the lithium-ion cell when experiencing an induced short circuit during thermal testing. Exemplary inventive practice describes a novel cell-coupled internal short simulated abuse test. An exemplary inventive embodiment equalizes or harmonizes a heating element's dc power supply with a dc power cell being tested. That is, in one or more impedance-related respects, the inherent character of the heating element's dc power supply "matches" the inherent character of the dc power cell being tested.

Featured by exemplary embodiments of the present invention is an association of (i) physical manifestations (e.g., power output or heating profile) that occur during thermal abuse testing, with (ii) physical properties (e.g., internal cell resistance, maximum operating current, or response to an external short circuit) intrinsic to an electrochemical cell. Exemplary inventive testing/evaluation of battery safety takes into consideration certain variations between and among cell designs and chemistries, and thus represents a significant improvement over presently used methods for battery safety testing/evaluation, which do not consider such variations. Inventive practice holds promise in advancing the capabilities of Government agencies and private industries in terms of the fidelity of their safety evaluations and the quality of their advanced lithium-ion battery system designs.

BRIEF DESCRIPTION OF THE DRAWINGS

The present invention will now be described, by way of example, with reference to the accompanying drawings, wherein like numbers indicate same or similar parts or components, and wherein.

DESCRIPTION OF EXEMPLARY EMBODIMENTS OF THE INVENTION

Figure 1:
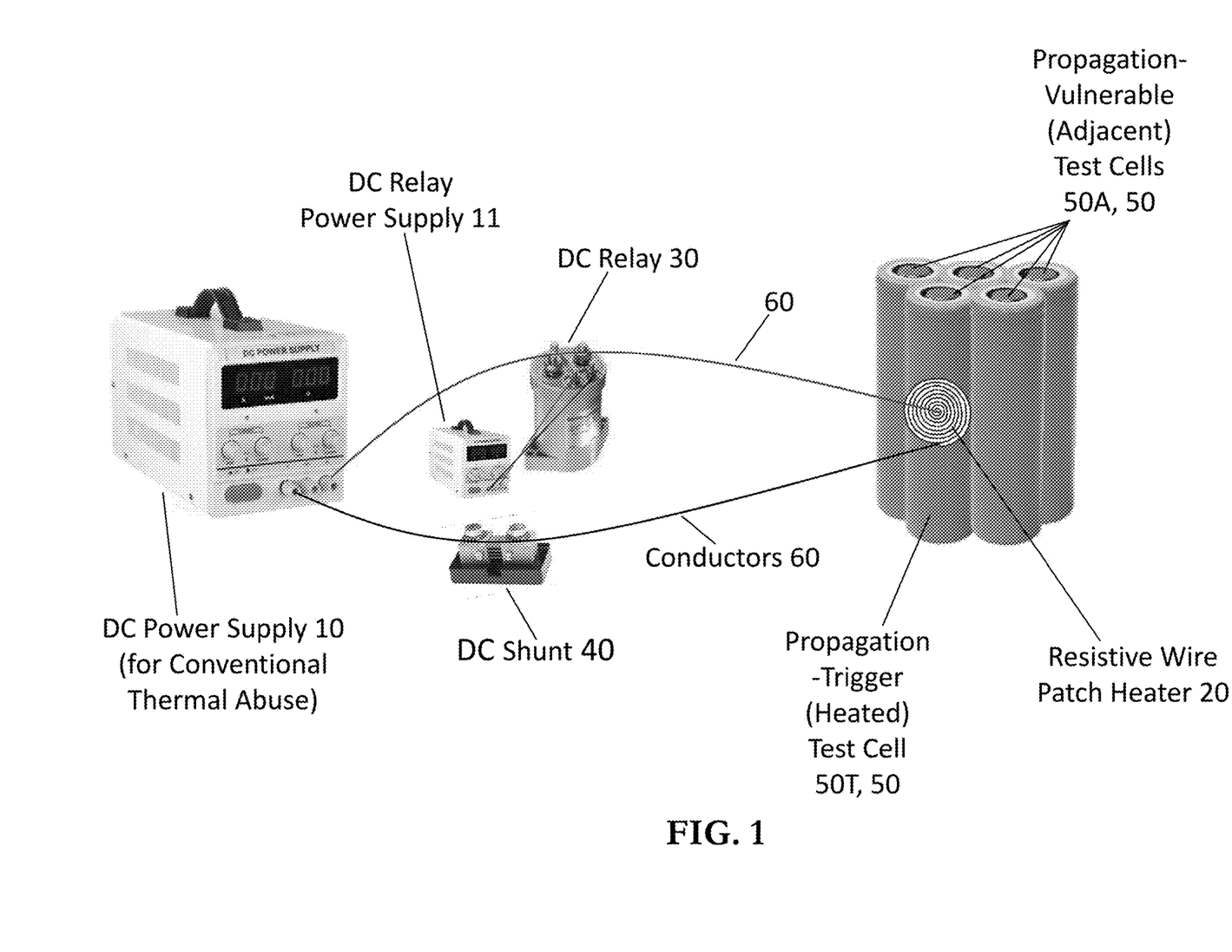
FIG. 1 is a schematic of an example of conventional practice of single cell thermal abuse testing.
Figure 2:
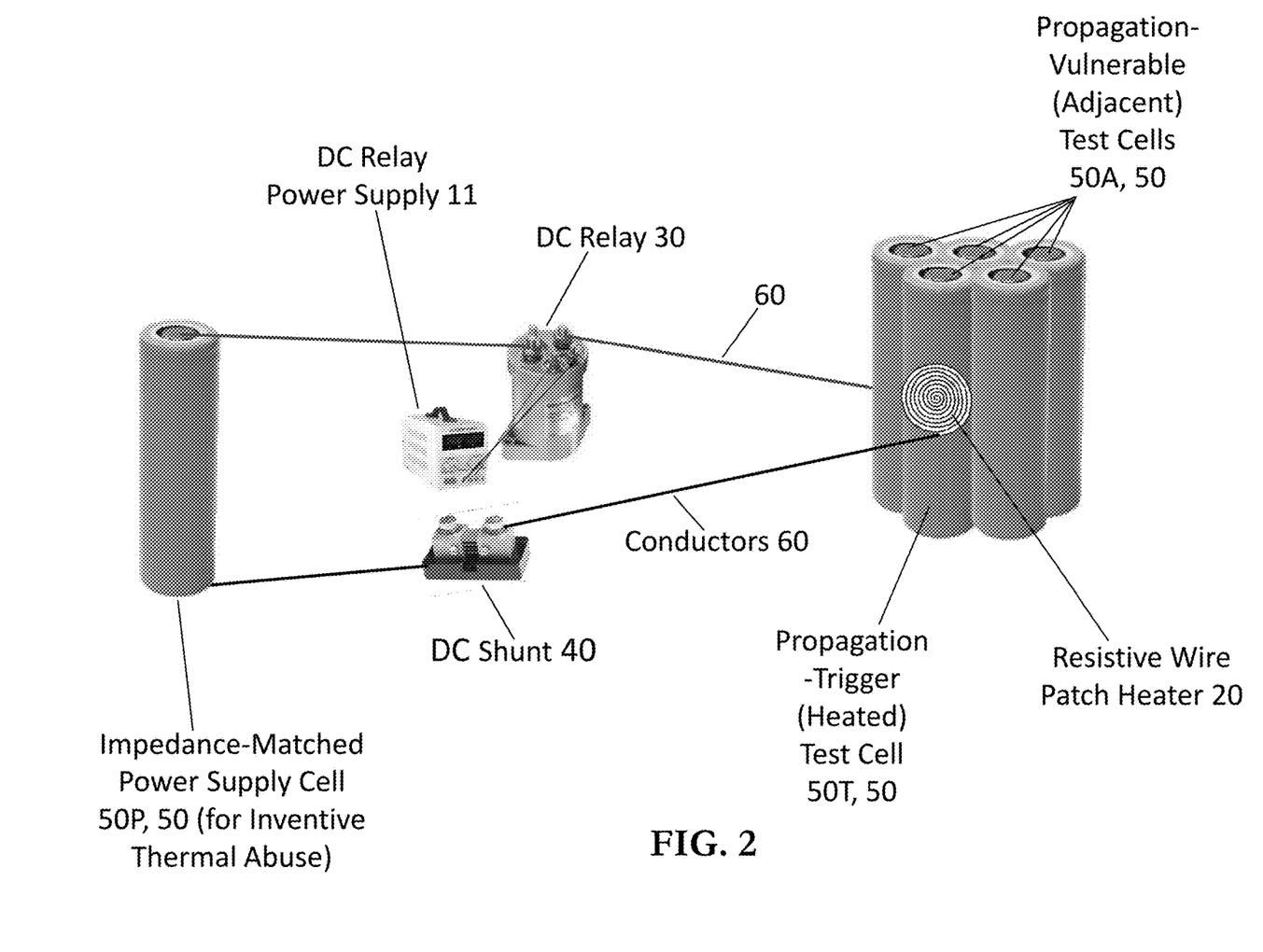
FIG. 2 is a schematic, similar to the schematic of FIG. 1, of an example of inventive practice of single cell thermal abuse testing.

The two wiring diagrams presented in FIG. 1 and FIG. 2 illustrate, respectively, conventional practice (FIG. 1) and inventive practice (FIG. 2) of thermal abuse testing of an electrochemical cell.

With reference to FIG. 1, an example of a conventional thermal abuse test uses a power supply 10 to provide electrical current to a resistive wire patch heater 20, which may be variously configured. The current is transmitted through a DC relay 30, the current from which is verified using an integrated DC shunt 40. DC relay 30 is powered by a DC relay power supply 11. Two kinds of electrochemical cells 50 are shown in FIG. 1, viz., a single propagation-trigger test cell 50T, and a plurality (e.g., a multiplicity) of propagation-vulnerable test cells 50A, which are proximate cell 50T. Heater 20 is associated with (e.g., attached to or otherwise coupled with) trigger cell 50T and, in the parlance of the electrochemical cell arts, is used to "thermally abuse" trigger cell 50T. As depicted in FIG. 1, trigger cell 50T is situated in relation to adjacent cells 50A as would be commonly found in a real-world application package of cells 50. Cells 50 are contiguously arranged whereby the corresponding longitudinal geometric axes of cells 50 are parallel. Trigger cell 50T is thus side-by-side with plural "adjacent" (e.g., neighboring or contiguous) cells 50.

In accordance with the example of conventional circuitry shown in FIG. 1, the current voltage and power relationship with the resistive heater 20 is constant, unlike the variability of this relationship typifying real-world conditions. In particular, according to conventional methodology the resistance of the resistive heater 20 itself is often arbitrary, and tests are defined as having set heating rates to be determined iteratively through power supply current adjustments. This approach allows a tester to maintain a slow or fast heating rate, albeit this rate is arbitrary and is not coupled to the cell design or the cell characteristics. In this conventional approach, there is no distinction between or among the failure behaviors of high-power or high-energy cells 50.

An exemplary embodiment of the present invention is shown in FIG. 2. As depicted in FIG. 2, an electrochemical cell 50, viz., DC power supply cell 50P, is used in place of DC power supply 10 shown in FIG. 1. As distinguished from power supply 10 shown in FIG. 1, the discharge characteristics of power supply cell 50P through resistive heater 20 vary in relation to ambient temperature, cell temperature, impedance, age, and/or capacity. Power supply cell 50P and trigger cell 50t are impedance-matched. The term "impedance-matched," as used herein, refers to a sharing, by two different cells (e.g., a power supply cell and a trigger cell), of intrinsic commonality in at least one respect selected among the following: resistance (e.g., internal cell resistance); capacitance (e.g., maximum operating current, or voltage capacity); inductance (e.g., response to an external short circuit). According to exemplary inventive practice, impedance-matching of a power supply cell 50P with a trigger cell 50T is accomplished by providing a power supply cell 50P that is of the same type, model, and/or manufacture as that of the trigger cell 50T.

Still referring to FIG. 2, an exemplary inventive method for conducting thermal abuse testing features, inter alia, an implementation of two identical or similar electrochemical cells for, respectively, (i) producing DC current and (ii) receiving DC current. A first cell 50, viz., power supply cell 50P, supplies DC current to a resistive wire patch heater 20. A second cell 50, viz., propagation trigger cell 50T, receives heat applied by the resistive wire patch heater 20. A large group of third cells 50, viz., propagation-vulnerable adjacent cells 50A, are susceptible to propagative behavior by virtue of the external thermal application to trigger cell 50T.

According to exemplary inventive practice, (i) physical manifestations during thermal abuse testing (e.g., testing involving power output or heating profile), are coupled to (ii) physical properties (e.g., internal cell resistance, and/or maximum operating current, and/or response to an external short circuit) of an electrochemical cell such as a lithium-ion battery. The present invention may be practiced with respect to multifarious types of electrochemical cells, including but not limited to lithium-ion types. The present invention allows for an improvement over presently used methods for battery safety testing, which do not consider the variations between cell designs and chemistries when conducting evaluations.

The present invention, as exemplarily embodied, couples the trigger test cell's discharge behavior to the trigger test cell's heating rate. In this novel manner, exemplary inventive practice creates a unique association of real-world failure characteristics with internal short simulated abuse testing. In particular, a cell's internal impedance may be used as a scaling mechanism and fixed. For example, the resistance of the customized patch heater could be set to be five or ten times the cell's internal impedance. While setting such a rate is still arbitrary to a degree, it does correlate cell design characteristics with test conditions, which is a main purpose of the present invention.

In general, cell impedance is a function of the cell construction (e.g., electrode or separator thickness, size and position of current collectors, and/or fraction of conductive additives in composite electrodes), the active materials used (e.g., electronic and/or ionic conductivities of electrodes and electrolyte), and the test conditions (e.g., temperature, state of charge, and/or cycling history). AC impedance measurement, also referred to as "electrochemical impedance spectroscopy" ("EIS"), is a common method to collect cell impedance as well as to de-convolute the magnitude and frequency dependence of various mechanisms leading to impedance rise. See, e.g., T. Momma et al., "AC Impedance Analysis of Lithium Ion Battery under Temperature Control," J. Power Sources, Volume 216, pages 304-307 (2012), incorporated herein by reference. Momma et al. summarize a typical deconvolution for lithium-ion battery ("LIB"). In addition to EIS, cell impedance can be collected through multiple other methods, including DC techniques such as described by H. G. Schweiger et al., "Comparison of Several Methods for Determining the Internal Resistance of Lithium Ion Cells," Sensors, Volume 10, pages 5604-5625 (2010), incorporated herein by reference. The methods disclosed by Schweiger et al. which capture the contributing factors to varying degrees. Manufacturers typically result the AC impedance collected at a single frequency, often 1000 Hz.

Figure 3:
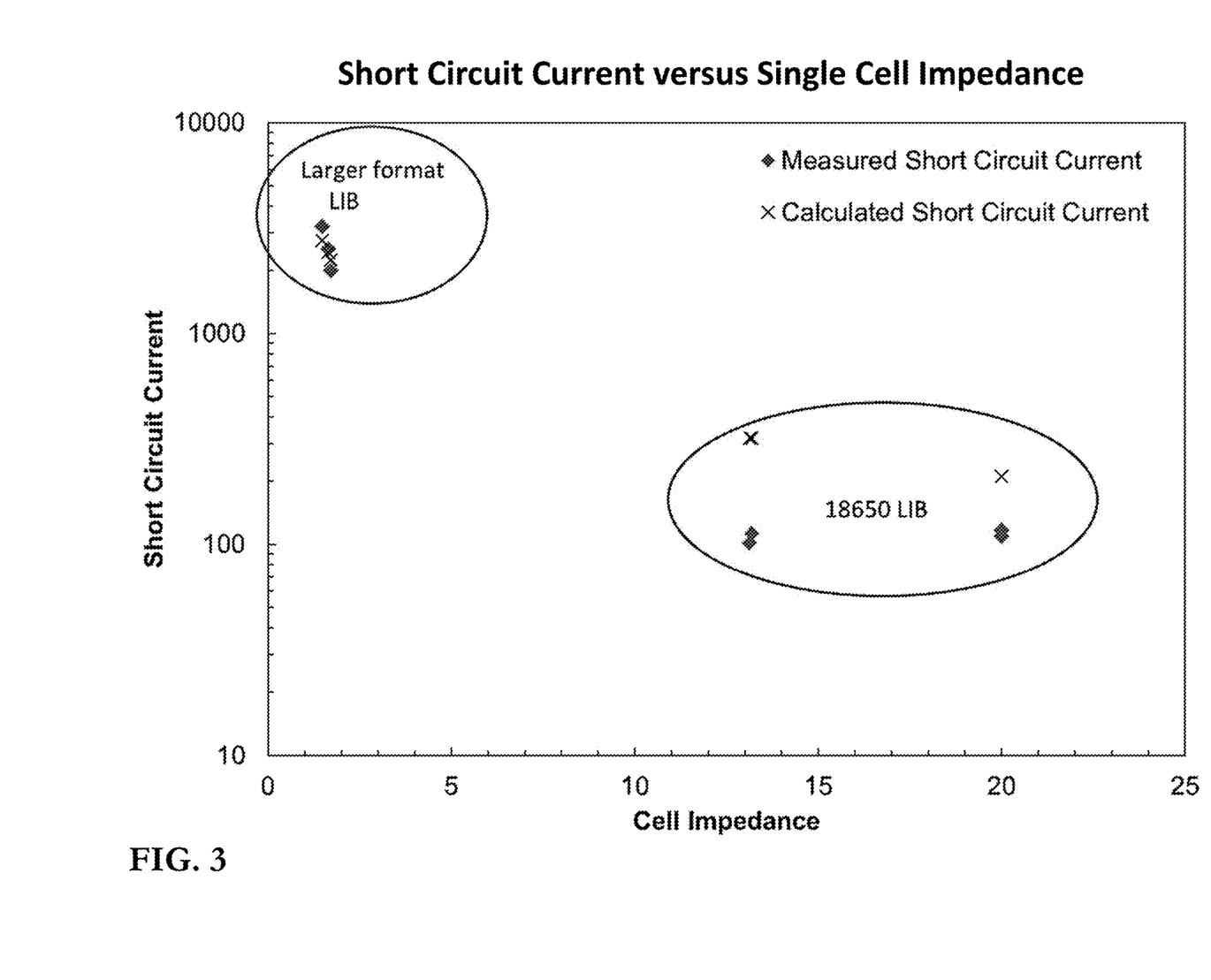
FIG. 3 is a graph illustrating an example of a relationship of short circuit current vs. cell impedance for lithium-ion batteries.

Another important concept related to exemplary inventive practice is the short circuit current, which is the current supplied by a cell when exposed to a low-resistance current pathway, resulting in a rapid discharge. With reference to FIG. 3, using the manufacturer-supplied impedance value and the open-circuit voltage (OCV) at 100% state of charge, a "maximum short circuit current" was calculated by the present inventors using Ohm's law ($I_{short} = V_{OCV}/R_{cell}$), and was compared to measured values that were obtained by applying a 13 µΩ external short circuit across the cells. In all cases, the calculated short circuit current was comparable to the observed short circuit current, albeit the calculated circuit current tended to be slightly higher than the observed short circuit current. This discrepancy was most likely due to the use of the 100% SOC voltage when calculating short circuit current, and to early termination of current flow due to activation of cell-level safety devices (e.g., a current interrupt device) during actual short circuit tests.

By way of example, an inventive method for conducting battery testing includes the following steps: (a) The cell impedance is determined by a suitable method. (b) The maximum short circuit current is defined using Ohms law, viz., $I_{short} = V_{OCV}/R_{cell}$. (c) A patch heater or other resistive element is sized relative to the internal resistance of the cell. (d) The total power supplied to the resistive element is defined by $P = I^2 R$ using the short circuit current $I_{short}$. (e) The area of the patch heater is determined based on cell geometry (e.g., the length and curvature of a cylindrical cell, or the flat face of a prismatic cell) to represent the desired packing arrangement of cells, or to achieve a desired heat flux. (f) The total energy supplied to the patch heater is defined based on the capacity of the cell or some fraction thereof.

Figure 4:
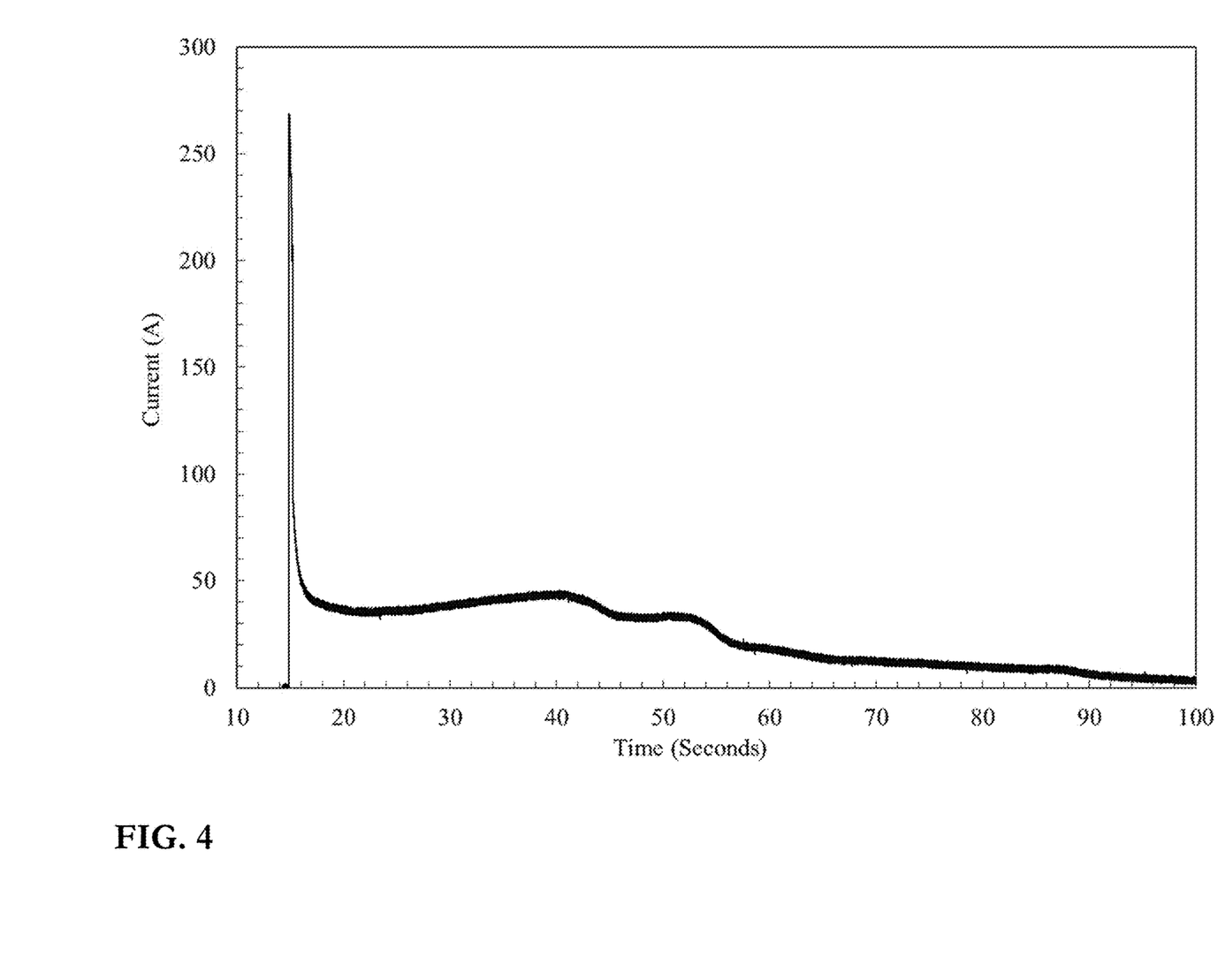
FIG. 4 is a graph illustrating an example of a short circuit in terms of current versus time.

FIG. 4 illustrates one example, in accordance with the present invention, of the current vs. time relationship of a short circuiting cell. The current profile delivered is associated with the age, internal impedance, temperature, cell design, chemistry, and/or resistance of the short circuit pathway. A graph such as that shown in FIG. 4 thus represents a cell-specific "fingerprint" of a short circuited cell. Heretofore, thermal abuse methodologies have never closely coupled cell characteristics with cell behavior, as accomplished by exemplary embodiments of the present invention.

Exemplary practice of the present invention features, inter alia, a utilization of the cells themselves as the power supplies for thermal abuse testing. As elaborated upon hereinbelow, among the possible benefits of inventive practice are scalability, flexibility, and greater accuracy.

Simulated internal short abuse testing in accordance with the present invention may afford improved accuracy. The resistances of internal short circuits are certain to vary in real world failures. Nevertheless, the present invention's coupling of cell abuse characteristics to the cell itself provides accurate correlations of temperature, voltage, and capacity to the abuse conditions.

Using the individual cell as an identified approach to cell abuse, allows test standards to be written that are consistent across all cell designs, while at the same time customized for each individual cell design architecture. By using a "scaling" of internal resistance as a standard, the heating rate of high power cells can match their increased proclivity for rapid high heating rates under short circuit conditions (lower impedance resistive heaters), while high energy cells can scale to their lower heating rate higher capacity failure behaviors (higher impedance resistive heaters).

Exemplary inventive practice is flexible insofar as it may be used to scale not only to each cell design, but to the cell's failure response under mid-life or end-of-life conditions. While present methods for propagation testing most often utilize new cells, aged cells are known to have higher internal impedances (e.g., from growth of the solid electrolyte interface, "SEI"), and will have different failure behaviors. The inventive methodology will provide a ready-made mechanism for capturing the failure difference by correlating the test conditions to the end-of-life cell's electrochemical condition.

Lithium-ion cells are emphasized herein as subjects of inventive thermal abuse tests; nevertheless, depending on the inventive embodiment, a variety of other cell types may be subjects of inventive testing. Furthermore, additive manufacturing (AM) is becoming a feasible technology for rapidly generating custom resistive patch heaters that may be implemented in inventive practice. In particular, while AM developments in steel are underway, so too are efforts in printable copper with a binder which can be sintered. As these new materials become available, they may open up further opportunities to apply inventive method in a cost-effective manner, such as involving utilization of Nichrome (nickel-chromium alloy) wire.

As shown in FIGS. 1 and 2, the trigger cell is one of many identical test cells in a pack. According to the conventional methodology illustrated in FIG. 1, failure of the trigger cell is initiated by forcing the trigger cell to a certain temperature, or by heating the trigger cell at a predetermined rate until failure. The conventional technique for creating a temperature change is arbitrary, or is at best empirically derived. Hence, a greater amount of energy and power is brought to bear by the power supply upon the trigger cell than would be necessary to initiate failure of the trigger cell under real conditions. That is, the energy (quantity of the energy) and the power (rate of delivery of the energy) that bring about failure of the trigger cell are not representative of, and in fact exceed, the energy and power characterizing the trigger cell under failure in an application setting.

As illustrated in FIG. 2, exemplary inventive practice implements a cell identical to the trigger cell as the power supply. The energy (quantity of the energy) and the power (rate of delivery of the energy) that bring about failure of the trigger cell are representative of the energy and power characterizing the trigger cell under failure in an application setting. Exemplary inventive practice subjects the trigger cell to a significantly more realistic scenario of a field failure. According to exemplary inventive testing, the thermal abuse of a lithium-ion battery is tailored to the failure of one of the constituent cells. According to some inventive embodiments, this is accomplished by using, as the power supply, a cell identical to the constituent cells. The electrochemical energy content of the power supply cell is converted into heat applied to the trigger cell at a rate that is defined by the intrinsic characteristics of the power supply cell, thereby avoid over-testing. The respective intrinsic characteristics of the power supply cell and the trigger cell are the same. The trigger cell is thus subjected to a more credible failure scenario.

Conventional thermal abuse testing seeks to determine what will cause a cell to fail. In contrast, inventive thermal abuse testing seeks to determine how adjacent test cells will react to a known quantifiable failure of a trigger test cell. As distinguished from conventional thermal abuse testing, inventive thermal abuse testing fixes the quantity (energy) and rate (power) of the delivery. The energy and power delivered by the power supply are not arbitrary, but rather are representative of the trigger test cell. Exemplary inventive practice is concerned with optimizing the evaluation of propagation-resistant architecture. A main objective of exemplary inventive testing is to determine a propagation-resistant battery architecture, based on a given set of circumstances. Exemplary inventive testing applies energy to the trigger test cell at the right place and in the right duration so as not to influence the propagation behavior of the test cells. The present invention is not concerned with determining what causes a battery to fail. Rather, the present invention is concerned with determining propagation behavior (e.g., propagation resistance) of adjacent cells, while minimizing or removing methodological or experimental bias or biases.

The impedance of the power supply will dictate the power output of the power supply. The term "impedance" is conventionally understood to refer to the summation of capacitive, inductive, and resistive effects due to cell construction and electrochemical behavior. A cell has a number of factors contributing to its impedance. Depending on the inventive embodiment, the power supply may be variously configured.

In general, identical cells from a particular manufacturer will have same impedance; hence, a preferred mode of inventive practice is to provide a power supply cell that is identical to the trigger cell. According to some inventive embodiments, the power supply cell is not identical to the trigger cell; however, the power of the power supply cell is at least substantially representative of the power of the trigger cell. Otherwise expressed, the power supply cell is at least substantially "impedance-matched" with respect to the trigger cell, such as by exhibiting similar capacity of voltage.

According to other inventive embodiments, a dynamically variable power supply is used instead of a power supply cell. A dynamically variable power supply has a power output that is at least substantially equal to the power of the trigger cell under short circuit conditions. Hence, a dynamically variable power supply is capable of mimicking the behavior of a cell in a manner such as illustrated in FIG. 4, which graphically represents current versus time for a lithium-ion cell under short-circuit conditions, wherein a huge spike in the profile indicates a short circuit. The patch is a conductor selectively placed to apply a fixed load to the trigger cell, thereby simulating a short circuit. According to exemplary inventive practice, the patch is not removed from the trigger cell until the trigger cell is completely dead. According to some inventive embodiments, the trigger cell is an inert surrogate cell that converts power supply into heat.

Figure 5:
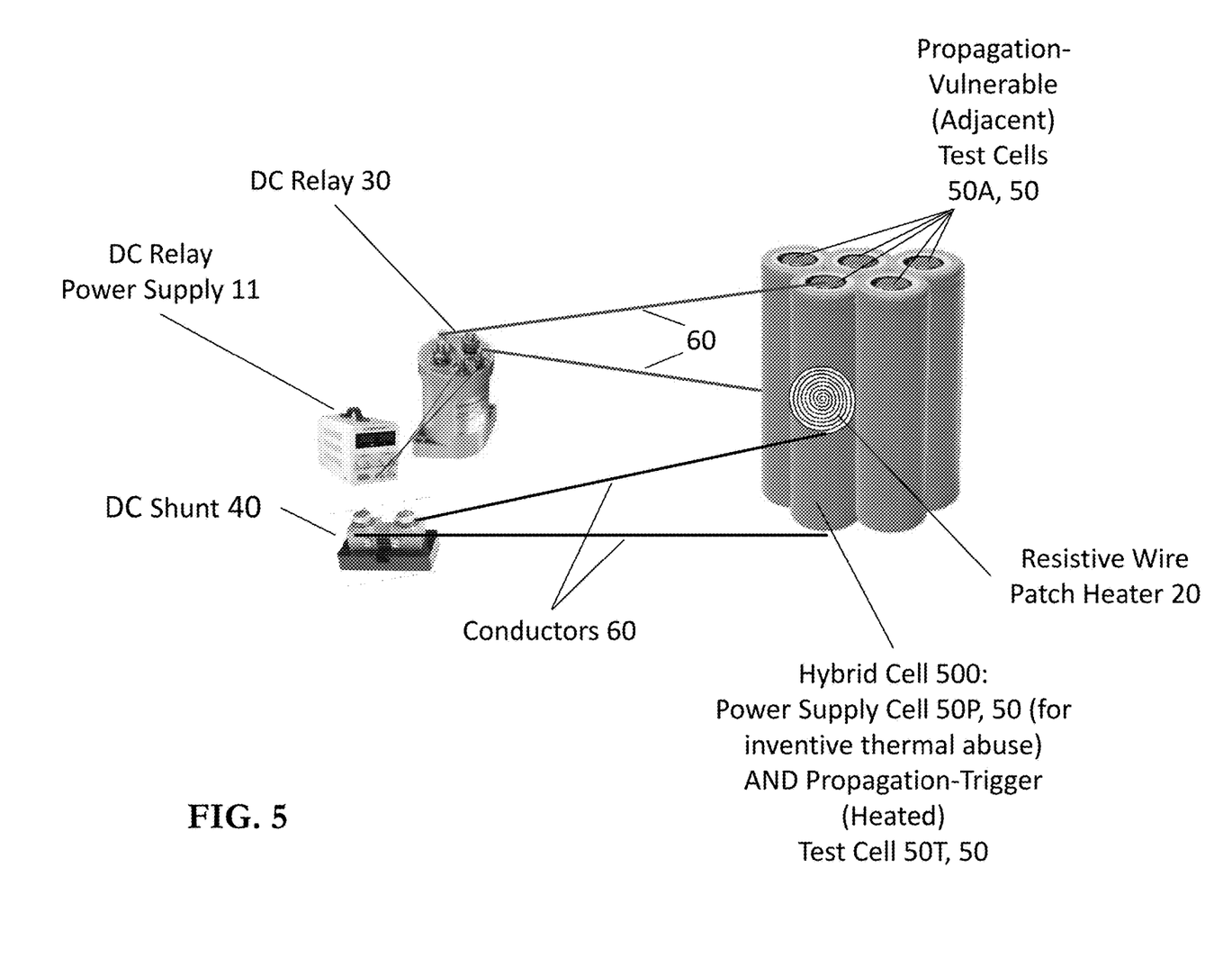
FIG. 5 is a schematic, similar to the schematic of FIG. 2, of a different example of inventive practice of single cell thermal abuse testing.

As illustrated by way of inventive example in FIG. 2, the power supply cell may be identical to the trigger cell such that the energy and power supplied to the resistive wire patch heater is representative of the cells contained in the battery pack. Now referring to FIG. 5, according to an alternative embodiment of the present invention, the trigger cell 50T and the power supply cell 50P are one and the same, viz., a hybrid cell 500, having a power supply cell 50P functional component and a trigger cell 50T functional component. The power supplied by the hybrid cell 50 (via its power supply cell 50P component) to the resistive wire patch heater 20 is used to heat itself, until the energy content of the power supply cell 50P component is depleted or the cell undergoes energetic failure. According to the exemplary inventive practice illustrated in FIG. 5, self-heating of hybrid cell 50 (via its power supply cell 50P component)

takes place due to current flow retained in the trigger cell 50T component of hybrid cell 50.

The present invention, which is disclosed herein, is not to be limited by the embodiments described or illustrated herein, which are given by way of example and not of limitation. Other embodiments of the present invention will be apparent to those skilled in the art from a consideration of the instant disclosure, or from practice of the present invention. Various omissions, modifications, and changes to the principles disclosed herein may be made by one skilled in the art without departing from the true scope and spirit of the present invention, which is indicated by the following claims.

What is claimed is:

1. A test method for an electrochemical cell, the method comprising associating a heating element with a test cell, and delivering current to said heating element, wherein:
   said delivering of said current to said heating element includes using a power supply cell, and results in heating of said heating element;
   said power supply cell and said test cell are electrochemical cells that are equivalent to each other, wherein said equivalence of said power supply cell and said test cell includes being at least approximately equal to each other with respect to at least one impedance-related characteristic that is intrinsic to said power supply cell and intrinsic to said test cell, said at least one impedance-related characteristic selected from the group consisting of resistance, capacitance, and inductance;
   said heating of said heating element causes a short-circuit current failure of said test cell, wherein said failure of said test cell is due to a short-circuit current in said test cell; and
   based on said equivalence of said power supply cell and said test cell, the amount of power and energy characterizing said power supply cell in said delivering of said current to said heating element, and the amount of power and energy characterizing said test cell in experiencing said short-circuit current failure, are at least approximately equal.

2. The test method of claim 1, wherein:
   said test cell is a propagation-trigger test cell;
   the method further includes closely configuring said propagation-trigger test cell with a plurality of adjacent test cells in a pack of said test cells;
   said short-circuit current failure of said propagation-trigger test cell results in propagative failure of at least one said adjacent test cell;
   said propagative failure of said at least one said adjacent test cell is at least substantially attributable to said short-circuit current failure of said propagation-trigger test cell.

3. The test method of claim 1, wherein said power supply cell and said test cell are identical electrochemical cells.

4. The test method of claim 1, wherein said power supply cell and said test cell are similar but not identical electrochemical cells.

5. The test method of claim 1, wherein the method further comprises replacing said power supply cell with a dynamically variable power supply that is capable of mimicking electrical behavior of said power supply cell in terms of said equivalence of said power supply cell and said test cell.

6. The test method of claim 1, wherein:
   said test cell is a propagation-trigger test cell;
   said power supply cell and said test cell are at least substantially identical electrochemical cells;
   the method further includes closely configuring said propagation-trigger test cell with a plurality of adjacent test cells in a pack of said test cells;
   said short-circuit current failure of said propagation-trigger test cell results in propagative failure of at least one said adjacent test cell;
   said propagative failure of said at least one said adjacent test cell is at least substantially attributable to said short-circuit current failure of said propagation-trigger test cell.

7. The test method of claim 1, wherein said at least one impedance-related intrinsic characteristic includes said resistance.

8. The test method of claim 7, wherein said at least one impedance-related intrinsic characteristic includes at least one of said capacitance and said inductance.

9. The test method of claim 1, wherein said at least one impedance-related intrinsic characteristic includes said resistance, said capacitance, and said inductance.

10. A method for evaluating propagation in an electrochemical cell pack, the method comprising including a trigger cell in a cell pack, associating a heating element with said trigger cell, using a power supply cell to provide current to said heating element, and using said heating element to apply heat to said trigger cell in said cell pack until said trigger cell undergoes short circuit current failure, wherein:
   said power supply cell and said trigger cell are equivalent electrochemical cells, said equivalence of said power supply cell and said trigger cell including an impedance-matching of said power supply cell and said trigger cell with respect to at least one electrical property selected from the group consisting of resistance, capacitance, and inductance, said at least one electrical property being intrinsic to said power supply cell and intrinsic to said trigger cell;
   there is an at least approximate equality, in terms of an amount of at least one of energy and power, between said power supply cell in providing said current and said trigger cell in undergoing said short circuit current failure;
   said at least approximate equality in terms of said amount of at least one of said energy and said power is related to said equivalence of said power supply cell and said trigger cell;
   a propagative behavior of said cell pack is at least substantially attributable to said short circuit failure of said trigger cell.

11. The method for evaluating propagation as recited in claim 10, wherein said power supply cell and said trigger cell are identical electrochemical cells.

12. The method for evaluating propagation as recited in claim 10, wherein said power supply cell and said trigger cell are similar but not identical electrochemical cells.

13. The method for evaluating propagation as recited in claim 10, wherein the method further comprises replacing said power supply cell with a dynamically variable power supply that is capable of mimicking electrical behavior of said power supply cell in terms of said equivalence of said power supply cell and said trigger cell.

14. The method for evaluating propagation as recited in claim 10, wherein said power supply cell and all of the cells in said cell pack are at least substantially identical electrochemical cells.

15. The method for evaluating propagation as recited in claim 14, wherein said power supply cell and all of the cells in said cell pack are identical electrochemical cells.

16. The method for evaluating propagation as recited in claim 14, wherein said power supply cell and all of the cells in said cell pack are similar but not identical electrochemical cells.

17. The method for evaluating propagation as recited in claim 10, wherein said at least one electrical property includes said resistance.

18. The method for evaluating propagation as recited in claim 17, wherein said at least one electrical property includes at least one of said capacitance and said inductance.

19. The method for evaluating propagation as recited in claim 10, wherein said at least one electrical property includes said resistance, said capacitance, and said inductance.

20. A method for evaluating propagation in an electrochemical cell pack, the method comprising including a hybrid electrochemical cell in an electrochemical cell pack, associating said hybrid electrochemical cell with a heating element, and using said heating element to apply heat to said hybrid electrochemical cell until said hybrid electrochemical cell undergoes a short circuit current failure that causes a propagative behavior of said electrochemical cell pack, wherein said hybrid power supply has a power supply component and a trigger cell component, wherein said power supply component provides current to said heating element, and wherein retention of said current by said trigger cell component results in said short circuit current failure.

* * * * *